United States Patent
Shibao

(10) Patent No.: US 8,064,216 B2
(45) Date of Patent: Nov. 22, 2011

(54) EDGE CONNECTOR

(75) Inventor: Shinji Shibao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 364 days.

(21) Appl. No.: 12/465,675

(22) Filed: May 14, 2009

(65) Prior Publication Data

US 2010/0151703 A1   Jun. 17, 2010

(30) Foreign Application Priority Data

Dec. 15, 2008 (JP) ................. 2008-318501

(51) Int. Cl.
*H05K 3/00* (2006.01)
(52) U.S. Cl. ........ 361/763; 361/760; 361/761; 361/767; 361/782; 361/728; 174/250; 174/260; 174/261; 174/262
(58) Field of Classification Search .......... 361/760, 361/761, 767, 782, 728–737, 808–811; 174/250, 174/260–262; 439/71, 70, 77, 67, 65
See application file for complete search history.

(56) References Cited

U.S. PATENT DOCUMENTS

| | | | | |
|---|---|---|---|---|
| 5,092,782 A | * | 3/1992 | Beaman | 439/65 |
| 5,219,292 A | * | 6/1993 | Dickirson et al. | 439/67 |
| 5,827,084 A | * | 10/1998 | Biernath | 439/262 |
| 7,596,863 B2 | * | 10/2009 | Bhatt et al. | 29/852 |
| 7,638,715 B2 | * | 12/2009 | Daikuhara et al. | 174/260 |
| 2005/0241954 A1 | | 11/2005 | Iwanami | |

FOREIGN PATENT DOCUMENTS

| | | |
|---|---|---|
| JP | 10-261598 A | 9/1998 |
| JP | 2002-164704 A | 6/2002 |
| JP | 2005-322868 A | 11/2005 |
| JP | 2006-041226 A | 2/2006 |

* cited by examiner

*Primary Examiner* — Tuan T Dinh
*Assistant Examiner* — Hung Dang
(74) *Attorney, Agent, or Firm* — Leydig, Voit & Mayer, Ltd.

(57) ABSTRACT

An edge connector includes, a multilayer printed board having an inner layer and a connector edge, an electronic circuit disposed on the multilayer printed board, an electrical terminal on the multilayer printed board and spaced by a predetermined clearance from the connector edge, an electrical conductor on the multilayer printed board and connected between the electronic circuit and the electrical terminal, a via connected to the electrical terminal and extending to the inner layer of the multilayer printed board, and a lead conductor on the inner layer of the multilayer printed board and connected at one end to the via, another end of the lead conductor being exposed at the connector edge. The electrical terminal is plated. The sum of the length of the via and the length of the lead conductor is less than one-sixth of the wavelength of an electrical signal transmitted.

4 Claims, 7 Drawing Sheets

EDGE CONNECTOR

BACKGROUND OF THE INVENTION

1. Field of the Invention

The present invention relates to an edge connector having at least one electroplated electrical terminal and to a method for manufacturing such an edge connector.

2. Background Art

An edge connector is a connector having at least one electrical terminal arranged along one side of its printed board. The electrical terminal is connected to an electronic circuit on the printed board by an electrical conductor formed on the board. The edge of the printed board on which the electrical terminal is disposed constitutes an edge of the edge connector, and is referred to as the "connector edge." The connector edge is inserted into a slot provided, e.g., on a motherboard. This slot is called an "edge connector adapter."

The insertion of the connector edge into the edge connector adapter results in the contact of the electrical terminal of the edge connector with a terminal mounted in the edge connector adapter. (This terminal of the edge connector adapter is later referred to as an "inter-terminal member.") As a result, the electronic circuit disposed on the printed board of the edge connector (hereinafter referred to as a "first electronic circuit) is electrically connected to an electronic circuit on the substrate or motherboard, etc. on which the edge connector adapter is disposed (hereinafter referred to as a "second electronic circuit), thereby allowing the exchange of electrical signals between these electronic circuits.

Incidentally, the edge connector may be inserted into and withdrawn from the edge connector adapter a plurality of times. (The cycle of such insertion and withdrawal of the edge connector is hereinafter referred to simply as the "mating/unmating cycle.") Therefore, the specifications of the edge connector include the maximum allowable number of mating/unmating cycles, or mating/unmating durability. The mating/unmating durability of an edge connector depends primarily on the mating/unmating characteristics of its electrical terminal. Typically, the electrical terminal is plated to ensure sufficient mating/unmating durability of the edge connector. In such a case, it is common to use electroplating, since this method of plating is simple and low cost and allows deposition of a thick plating having good adhesion.

An electroplating method is described, e.g., in Japanese Laid-Open Patent Publication No. 2005-322868. Other prior art includes Japanese Laid-Open Patent Publication Nos. 10-261598 (1998), 2002-164704, and 2006-41226.

Electroplating the electrical terminal requires an electric current to be supplied to the terminal after immersing it in a plating solution. In many cases a plating electrode and a lead wire or conductor for electroplating are provided on the printed board to accomplish this purpose. More specifically, the lead conductor for electroplating is connected at one end to the electrical conductor connected between the electrical terminal and the electronic circuit of the edge connector. The other end of the lead conductor is connected to the plating electrode. With this connection, a voltage is applied to the plating electrode to electroplate the electrical terminal.

After completion of the electroplating, the portion of the printed board having the plating electrode thereon is severed together with a portion of the lead conductor to reduce the size of the edge connector. The resulting printed board of the edge connector includes the remaining portion of the lead conductor. It has been found, however, that when such an edge connector is used for transmission of high frequency electrical signals, this remaining portion of the lead conductor acts as an open stub, thereby adversely affecting or degrading the signals.

To avoid this problem, the electrical terminal may be electrolessplated, instead of being electroplated, since electrolessplating does not require any lead conductor for plating. However, electrolessplating is disadvantageous in that the plating deposition rate is slow, with the result that it takes a long time to deposit a plating of the desired thickness, thus lowering the productivity. Further, electrolessplating is relatively high in cost as compared to electroplating, since the solution for electrolessplating need be frequently replaced. Furthermore, generally, plating deposited by electrolessplating has lower adhesion than plating deposited by electroplating, limiting and reducing the mating/unmating durability of the edge connector.

Thus, electrolessplating of electrical terminals is accompanied by problems such as lower productivity, increased cost, and decreased mating/unmating durability.

On the other hand, the lead conductor for electroplating may be shortened to avoid degradation of the electrical signals transmitted through the electrical conductor. Shortening of the lead conductor may be achieved by extending it toward the connector edge of the printed board, instead of toward any other edge of the printed board. However, it is necessary that no components (i.e., terminals, etc.) be present within a predetermined distance from the connector edge toward the center of the printed board. (This peripheral margin region is referred to as a "clearance.") As a result, the lead conductor for electroplating cannot be extended toward the connector edge of the printed board.

This means that the lead conductor for electroplating must be extended from the electrical conductor or electrical terminal to an edge of the printed board other than the connector edge. (This edge is spaced a greater distance from the electrical conductor and electrical terminal than is the connector edge.) Electroplating is performed by applying a voltage to such a lead conductor through a plating electrode on the printed board. The portion of the printed board on which the plating electrode is disposed is subsequently removed after completion of the electroplating, as described above. This means that it is difficult to make the lead conductor short enough not to degrade the electrical signals transmitted through the electrical conductor.

SUMMARY OF THE INVENTION

The present invention has been made to solve the above problems. It is, therefore, an object of the present invention to provide an edge connector in which the electrical signals transmitted through its electrical conductor suffer little degradation although the edge connector includes a portion of the lead conductor that was used to electroplate the electrical terminal of the connector. Another object of the present invention is to provide a method for manufacturing such an edge connector.

According to one aspect of the present invention, an edge connector includes, a multilayer printed board having an inner layer and a connector edge, an electronic circuit disposed on the multilayer printed board, an electrical terminal formed on the multilayer printed board and spaced with a predetermined clearance from the connector edge, an electrical conductor formed on the multilayer printed board and connected between the electronic circuit and the electrical terminal, a via connected to the electrical terminal and extending to the inner layer of the multilayer printed board, and a lead conductor formed on the inner layer of the multilayer printed board and connected at one end to the via, the other end of the lead conductor being exposed at the connector edge. The electrical terminal is plated. The sum of the length of the via and the length of the lead conductor is less than one-sixth of the signal band wavelength of an electrical signal transmitted through the electrical conductor.

According to another aspect of the present invention, an edge connector includes a printed board having a connector edge, an electronic circuit disposed on the printed board, an electrical terminal formed on the printed board and spaced with a predetermined clearance from the connector edge, an electrical conductor formed on the printed board and connected between the electronic circuit and the electrical terminal, and a lead conductor formed on the printed board and connected at one end to the electrical conductor or the electrical terminal, the other end of the lead conductor extending to an edge of the printed board other than the connector edge. The electrical terminal is plated. The lead conductor has an impedance that does not affect an electrical signal transmitted through the electrical conductor.

According to another aspect of the present invention, a method for manufacturing an edge connector including a multilayer printed board having an inner layer, includes the steps of providing a structure including the multilayer printed board, an electrical terminal formed on the multilayer printed board, a plating electrode formed on the multilayer printed board, a first via connected to the electrical terminal and extending to the inner layer of the multilayer printed board, a second via connected to the plating electrode and extending to the inner layer of the multilayer printed board, and a lead conductor connected at one end to the first via and at the other end to the second via, the electrical terminal being connected to the plating electrode through the first via, the lead conductor, and the second via, electroplating the electrical terminal, severing a portion of the multilayer printed board after the electroplating, the severed portion having the plating electrode thereon and including a portion of the lead conductor, and mounting an electronic circuit on the multilayer printed board, the electronic circuit being connected to the electrical terminal by an electrical conductor. the severing forms a connector edge of the multilayer printed board. the electrical terminal is spaced with a predetermined clearance from the connector edge. The sum of the length of the first via and the length of the portion of the lead conductor remaining in the multilayer printed board after the severing is less than one-sixth of the signal band wavelength of an electrical signal transmitted through the electrical conductor.

According to another aspect of the present invention, a method for manufacturing an edge connector including a printed board having a connector edge, includes the steps of providing a structure including the printed board, an electrical terminal formed on the printed board, a plating electrode formed on the printed board, and a lead conductor formed on the printed board and connected between the electrical terminal and the plating electrode, electroplating the electrical terminal, severing a portion of the printed board after the electroplating, the severed portion having the plating electrode and a portion of the lead conductor thereon, and mounting an electronic circuit on the printed board, the electronic circuit being connected to the electrical terminal by an electrical conductor. The severing forms an edge of the printed board other than the connector edge. The electrical terminal is spaced with a predetermined clearance from the connector edge. The portion of the lead conductor remaining on the printed board after the severing has an impedance that does not affect an electrical signal transmitted through the electrical conductor.

Other and further objects, features and advantages of the invention will appear more fully from the following description.

DETAILED DESCRIPTION OF THE PREFERRED EMBODIMENTS

First Embodiment

A first embodiment of the present invention relates to an edge connector having a construction that allows shortening of the conductor used to electroplate the electrical terminal of the connector, and also relates to a method for manufacturing such an edge connector. The present embodiment will be described with reference to FIGS. 1 to 11. It should be noted that like numerals represent like materials or like or corresponding components, and these materials and components may be described only once.

Figure 1:
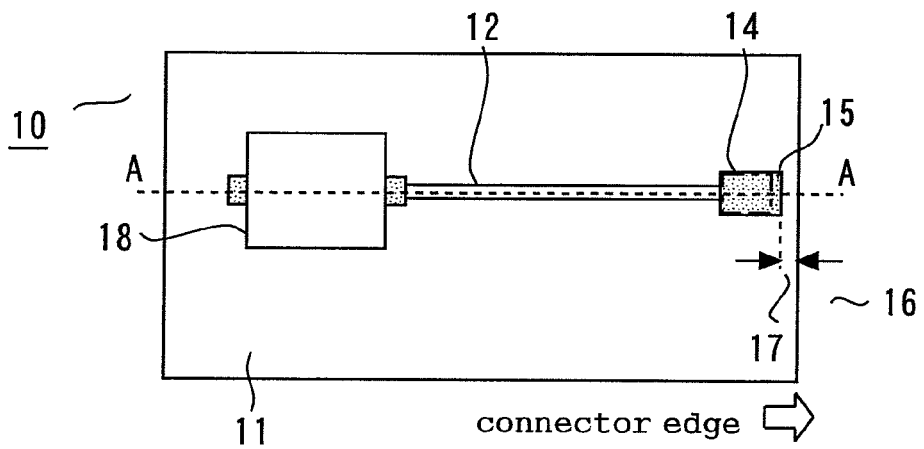
FIG. 1 is a plan view of an edge connector of the first embodiment.

FIG. 1 is a plan view of an edge connector 10 of the present embodiment. The edge connector 10 includes a multilayer printed board 11 on which a first electronic circuit 18 is disposed. An electrical terminal 14 covered with metal plating 15 is also disposed on the multilayer printed board 11 and spaced with a predetermined clearance 17 from a connector edge 16 of the edge connector 10 or multilayer printed board 11. The connector edge 16 is inserted into and withdrawn from an edge connector adapter, etc. as described later. In FIG. 1, the metal plating 15 covering the electrical terminal 14 is indicated by a broken line.

The electrical terminal 14 is electrically connected to the first electronic circuit 18 by an electrical conductor 12, which is a conductor pattern formed on the multilayer printed board 11.

Figure 2:
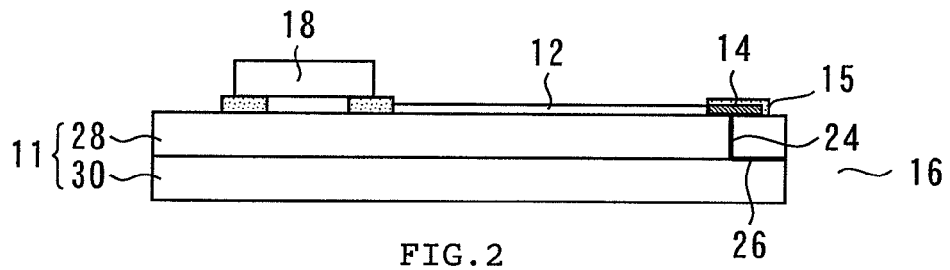
FIG. 2 is a cross-sectional view taken along broken line A-A of FIG. 1.

FIG. 2 is a cross-sectional view taken along broken line A-A of FIG. 1. As shown in FIG. 2, the multilayer printed board 11 of the present embodiment includes a first substrate 30 and a second substrate 28 staked on top of the first substrate 30. A first via 24 is formed through the second substrate 28 and connected at one end to the electrical terminal 14. Further, a first lead conductor 26 is formed on the first substrate 30 and connected at one end to the other end of the first via 24. The other end of the first lead conductor 26 is exposed at the connector edge 16. Thus, the edge connector 10 of the present embodiment includes the first via 24 and the first lead conductor 26, which are series connected to form a continuous conductor. One end of this conductor is connected to the electrical terminal 14, and the other end first extends toward the first substrate 30 (or the inner layer) of the multilayer printed board 11 and then extends to the connector edge 16.

When the edge connector 10 is used, the first electronic circuit 18 of the present embodiment is connected to another electronic circuit through the electrical conductor 12, the electrical terminal 14, etc. to transmit and receive electrical signals in a predetermined signal band to and from that electronic circuit. The first via 24 and the first lead conductor 26 are so formed that the sum of their lengths is less than $\lambda/6$, where $\lambda$ is the signal band wavelength of these electrical signals transmitted and received by the first electronic circuit 18. This completes the description of the configuration of the edge connector 10 of the present embodiment. There will now be described a method for manufacturing and using the edge connector 10 according to the present embodiment.

Figure 3:
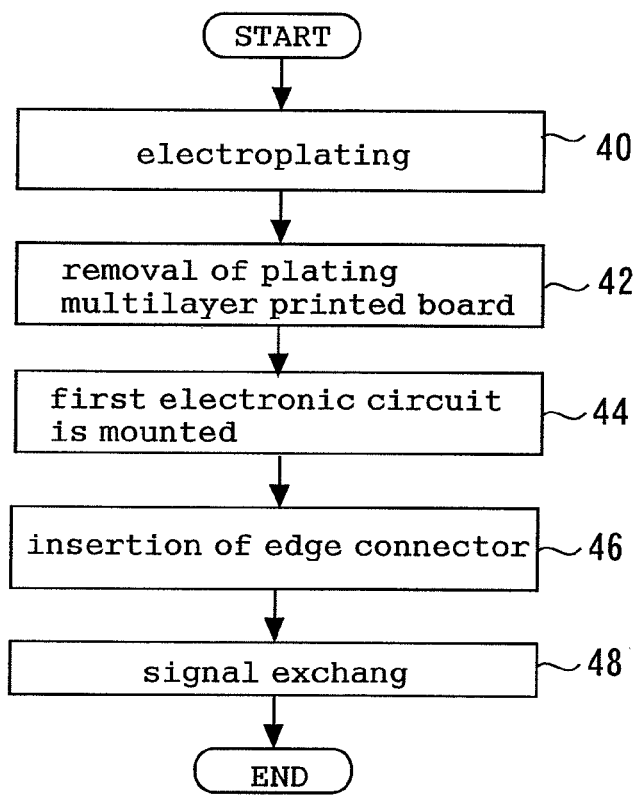
FIG. 3 is a flowchart illustrating the method for manufacturing and using the edge connector.
Figure 4:
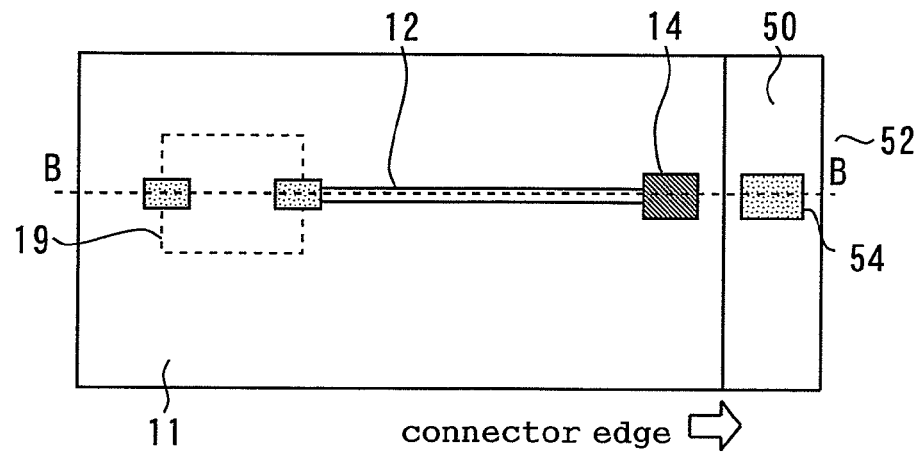
FIG. 4 shows the construction before plating.

FIG. 3 is a flowchart illustrating the method for manufacturing and using the edge connector 10 of the present embodiment. The method begins at step 40 by electroplating the electrical terminal 14. This step will be described with reference to FIGS. 4 and 5. The multilayer printed board 11 described above initially has a plating multilayer printed board 50 (a multilayer printed board used for plating) integrally attached thereto, as shown in FIG. 4, when the electrical terminal 14 is electroplated. The plating multilayer printed board 50 has a plating electrode 54 thereon to which a voltage is applied when electroplating the electrical terminal 14.

The plating multilayer printed board 50 integrally attached to the multilayer printed board 11 is removed after completion of the electroplating. That is, these multilayer printed boards 11 and 50 form a single continuous multilayer printed board before and during the electroplating process, i.e., before they are severed from each other. Therefore, the plating multilayer printed board 50 includes a first plating substrate 62 (a substrate used for plating) which corresponds to the first substrate 30 of the multilayer printed substrate 11. The plating multilayer printed board 50 also includes a second plating substrate 60 which corresponds to the second substrate 28 of the multilayer printed substrate 11. (See FIG. 5, which is a cross-sectional view taken along broken line B-B of FIG. 4.)

Figure 5:
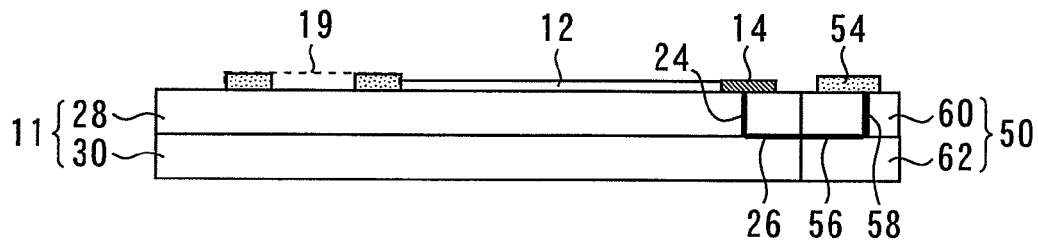
FIG. 5 is a cross-sectional view taken along broken line B-B of FIG. 4.

As can be seen from FIG. 5, the electrical terminal 14 is connected to the plating electrode 54 by vias and conductors formed within the multilayer printed boards 11 and 50. Specifically, the first lead conductor 26 formed on the first substrate 30 is connected to a second lead conductor 56 formed on the first plating substrate 62. The second lead conductor 56 is also connected to a second via 58 which is formed through the second plating substrate 60 and which is connected to the plating electrode 54.

That is, the electrical terminal 14 is connected to the plating electrode 54 through the first via 24, the first and second lead conductors 26 and 56, and the second via 58. With this connection, a voltage is applied to the plating electrode 54 to electroplate the electrical terminal 14. It should be noted that when the electrical terminal 14 is electroplated at step 40, the multilayer printed substrate 11 does not yet have an electronic circuit mounted thereon and only has an electric circuit mounting terminal 19 thereon.

After completion of step 40, the method proceeds to step 42 at which the plating multilayer printed board 50 is removed. This step 42 will be described with reference to FIGS. 6 and 7. The severing of the plating multilayer printed board 50 from the multilayer printed board 11 forms the connector edge 16 of the multilayer printed board 11. The electrical terminal 14 covered with the plating 15 is spaced with a predetermined clearance 17 from the connector edge 16. This clearance 17 is the minimum distance required between the electrical terminal 14 and the connector edge 16, and is typically, but not limited to, approximately 0.5 mm. According to the present embodiment, the sum of the length of the first via 24 and the length of the first lead conductor 26 is less than $\lambda/6$, where $\lambda$ is the signal band wavelength of the electrical signals transmitted through the electrical conductor 12 when the edge connector 10 is in use. Therefore, the clearance 17 is determined by this condition.

Figure 6:
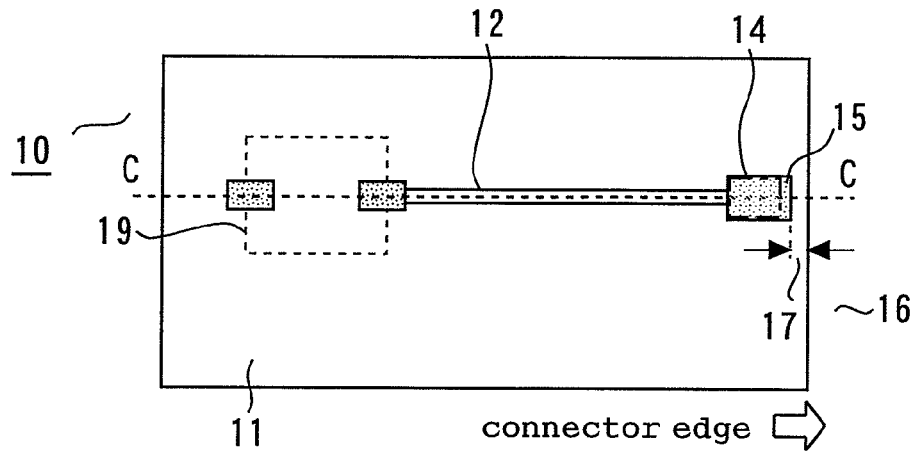
FIG. 6 shows the cut printed board.
Figure 7:
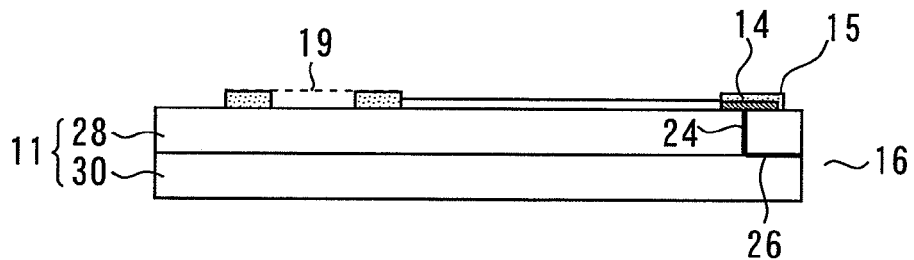
FIG. 7 is a cross-sectional view taken along broken line C-C of FIG. 6.

FIG. 7 is a cross-sectional view taken along broken line C-C of FIG. 6. As shown in FIG. 7, one end of the first lead conductor 26 is connected to the first via 24, and the other end is exposed at the connector edge 16.

After completion of step 42, the method proceeds to step 44 at which the first electronic circuit is mounted. Specifically, the first electronic circuit is mounted on the electronic circuit mounting terminal 19 shown in FIG. 6. This step completes the manufacture of the edge connector 10 shown in FIGS. 1 and 2.

After completion of step 44, the method proceeds to step 46 at which the edge connector 10 is set up for use with an external circuit. Specifically, the edge connector 10 is inserted into an edge connector adapter at step 46. This step will be described with reference to FIGS. 8, 9, and 10. The edge connector adapter, 72, into which the edge connector 10 is inserted, and its related components will be first described with reference to FIG. 8.

The edge connector adapter 72 is disposed on a substrate 70 and includes an inter-terminal member 74 of a metal. The inter-terminal member 74 is coupled by solder, etc. to an adapter electrical terminal 76 formed on the substrate 70. The substrate 70 also has an electronic circuit mounting terminal 80 formed thereon. A second electronic circuit 82 is mounted on the electronic circuit mounting terminal 80 and connected to the first electronic circuit 18 on the multilayer printed board 11, as described below, to transmit and receive electrical signals to and from the first electronic circuit 18.

The adapter electrical terminal 76 described above is connected to the electronic circuit mounting terminal 80 by an electrical conductor 78 formed on the substrate 70. That is, the inter-terminal member 74 is electrically connected to the second electronic circuit 82.

Figure 8:
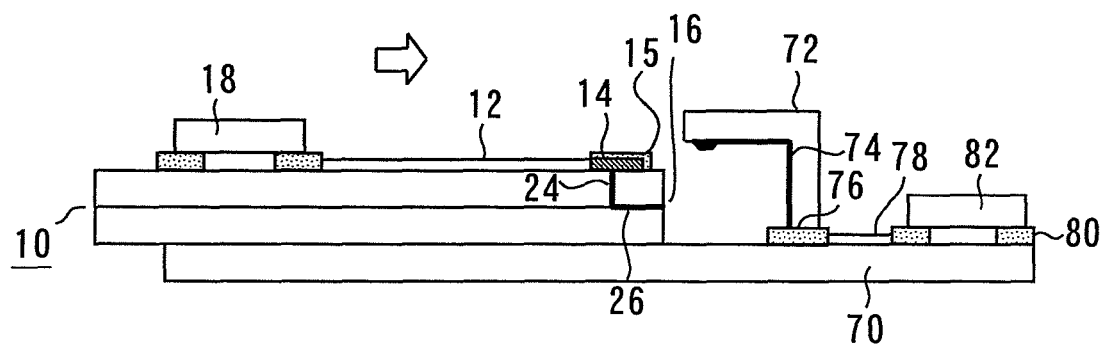
FIG. 8 shows the insertion of edge connector into the edge connector adaptor.

At step 46, the edge connector 10 is slid along the substrate 70 and inserted into the edge connector adapter 72, as indicated by the arrow in FIG. 8.

Figure 9:
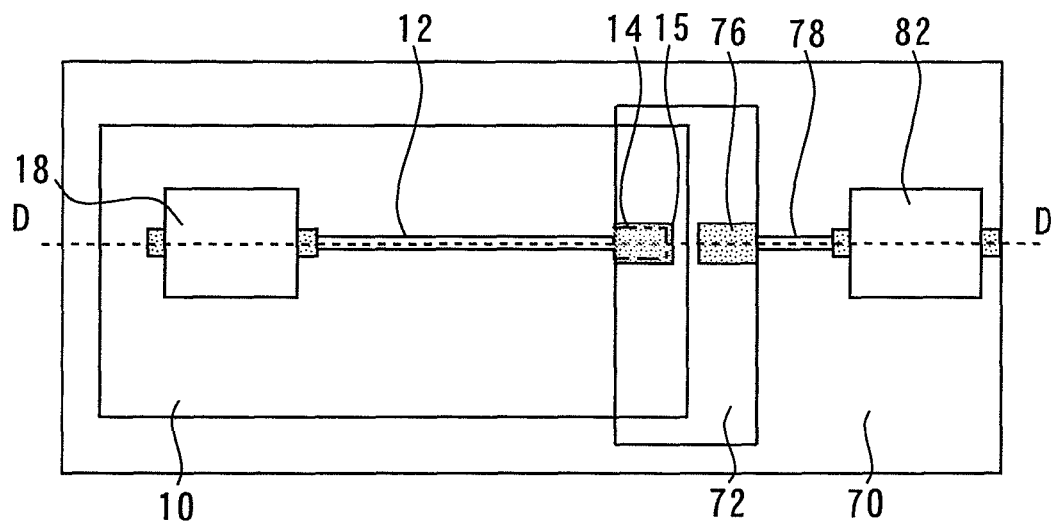
FIG. 9 illustrates the edge connector after it has been inserted into the edge connector adapter.
Figure 10:
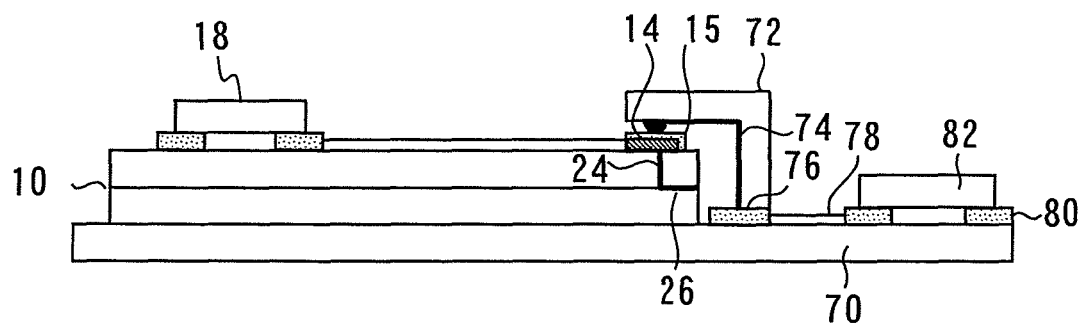
FIG. 10 is a cross-sectional view taken along broken line D-D of FIG. 9.

FIG. 9 illustrates the edge connector 10 after it has been inserted into the edge connector adapter 72. Further, FIG. 10 is a cross-sectional view taken along broken line D-D of FIG. 9. The full insertion of the edge connector 10 into the edge connector adapter 72 results in the contact of the tip of the inter-terminal member 74 with the electrical terminal 14 covered with the plating 15, with the result that the first electronic circuit 18 is electrically connected to the second electronic circuit 82.

After completion of step 46, the method proceeds to step 48 at which electrical signals are exchanged between the first electronic circuit 18 and the second electronic circuit 82. This step will be described with reference to FIG. 11.

Figure 11:
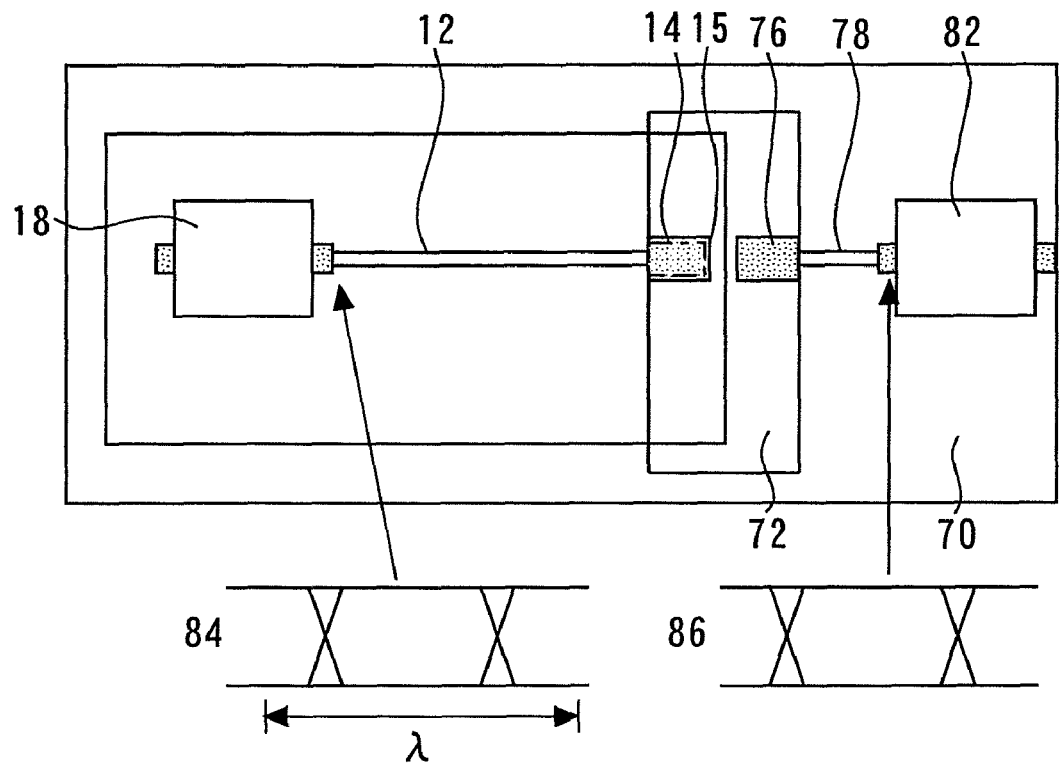
FIG. 11 shows the output waveform from the first electronic circuit and the input waveform to the second electronic circuit.

FIG. 11 shows the output waveform 84 from the first electronic circuit 18 and the input waveform 86 to the second electronic circuit 82. According to the present embodiment, the electrical signal output from the electronic circuit 18 is a high frequency signal having a signal band wavelength of λ. The input waveform 86 to the second electronic circuit 82 is identical to the output waveform 84 from the first electronic circuit 18, indicating that the high frequency signal suffers no degradation. This completes the description of the method for manufacturing and using the edge connector 10 according to the present embodiment. It should be noted that the inter-terminal member 74 is omitted from FIGS. 9 and 11 for convenience of illustration.

Thus according to the present embodiment, the electrical terminal 14 is electroplated with the plating 15, resulting in higher productivity, lower cost, and increased mating/unmating durability of the edge connector as compared to when the electrical terminal 14 is electrolessplated.

When the edge connector 10 of the present embodiment is in use, the first via 24 and the first lead conductor 26 connected thereto act together as an open stub. However, according to the present embodiment, the sum of the length of the first via 24 and the length of the first lead conductor 26 is less than λ/6, which is small enough not to affect the characteristics of the high frequency signals having a wavelength of λ exchanged between the first electronic circuit 18 and the second electronic circuit 82. That is, no substantial signal energy leaks through the open stub.

Thus the present embodiment provides an improved edge connector that does not degrade the electrical signals passing therethrough, and also provides a simple method for manufacturing such an edge connector.

Although in the present embodiment the edge connector includes only one electrical terminal, it is to be understood that in other embodiments it may include a plurality of electrical terminals arranged along the connector edge and still achieve the advantages of the present invention described above.

Although in the present embodiment the multilayer printed board includes the first and second substrates, it is to be understood that in other embodiments it may includes three or more substrates. Such a construction also ensures that the electrical terminal can be electroplated using a conductor formed on one of the inner substrates or layers of the multilayer printed board, and that this conductor can be made short enough not to degrade the electrical signals passing through the edge connector, thus retaining the advantages of the present invention described above.

Second Embodiment

A second embodiment of the present invention relates to an edge connector that includes a lead conductor for electroplating configured not to adversely affect the high frequency electrical signals passing through the edge connector regardless of the length of the lead conductor. This embodiment also relates to a method for manufacturing such an edge connector. This embodiment will be described with reference to FIGS. 12 to 19. It should be noted that throughout the first and second embodiments, like numerals represent like materials or like or corresponding components, and these materials and components may be described only once.

Figure 12:
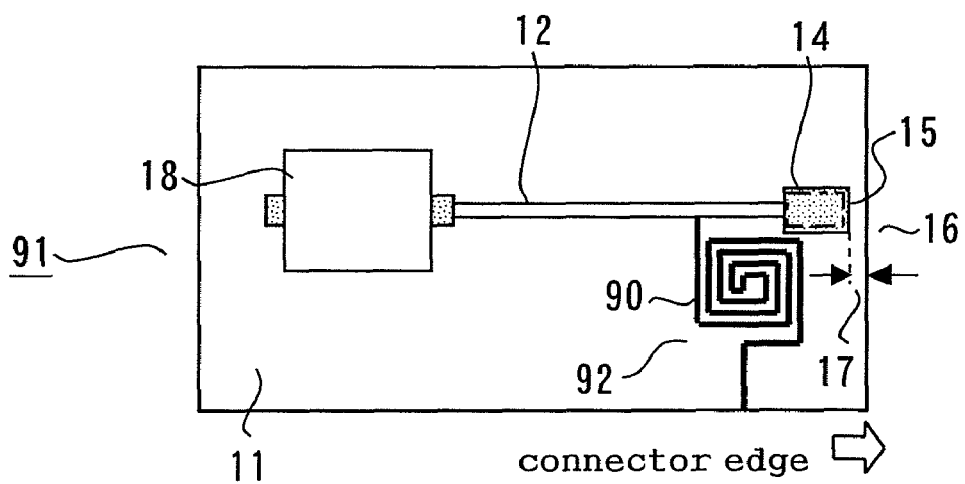
FIG. 12 is a plan view illustrating an edge connector of the second embodiment.

FIG. 12 is a plan view illustrating an edge connector 91 of the present embodiment. The edge connector 19 is similar to the edge connector of the first embodiment, except that the first via 24 and the first lead conductor 26 for plating are replaced by a lead conductor 92 for plating. According to the present embodiment, the lead conductor 92 is formed entirely on the multilayer printed board 11. One end of the lead conductor 92 is connected to the electrical conductor 12, and the other end of the lead conductor 92 extends to an edge of the multilayer printed board 11 other than the connector edge 16. As shown in FIG. 12, the lead conductor 92 includes a spiral inductor 90, which makes the impedance of the lead conductor 92 high. More specifically, the number of turns of the spiral inductor 90 is such that the impedance of the lead conductor 92 is high enough not to affect the electrical signals transmitted through the electrical conductor 12.

There will now be described a method for manufacturing and using the edge connector 91. This manufacturing method, like that of the first embodiment, begins with an electroplating step and proceeds to a plating multilayer printed board removing step and then to an electronic circuit mounting step, which completes the manufacture of the edge connector. After completion of the manufacture of the edge connector, a step of inserting the edge connector into an edge connector adapter is performed and followed by an electrical signal transmitting step. Each process step will now be described.

Figure 13:
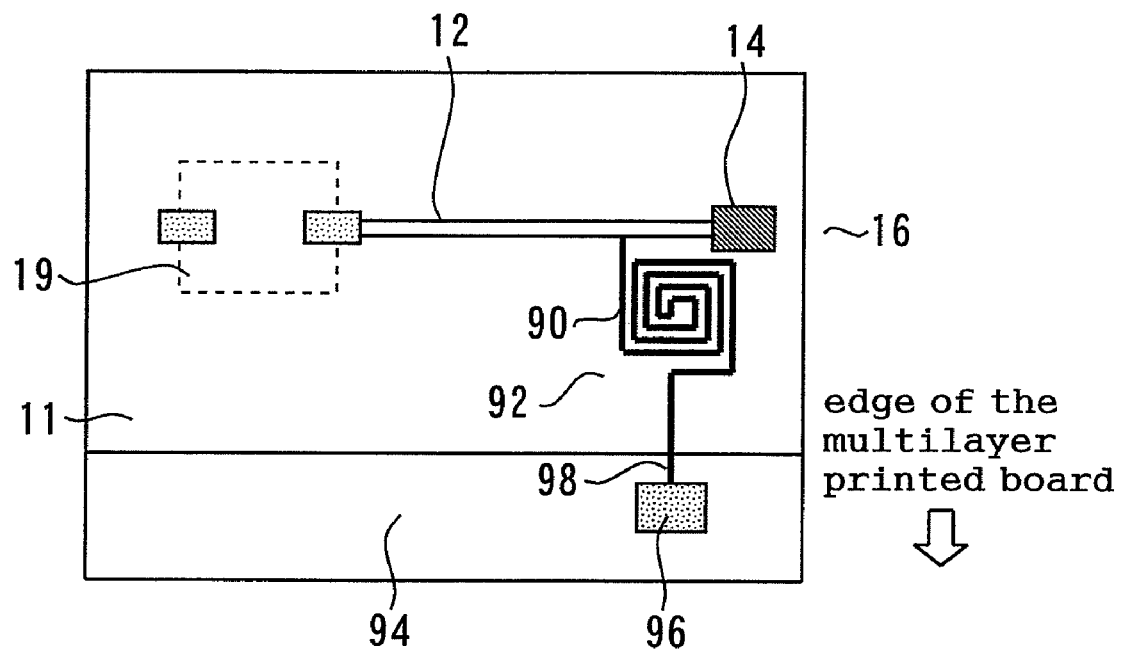
FIG. 13 is a diagram illustrating the electroplating step.

FIG. 13 is a diagram illustrating the electroplating step. As shown in FIG. 13, the multilayer printed board 11 initially has a plating multilayer printed board 94 (a multilayer printed board for plating) integrally attached thereto when the electrical terminal 14 is electroplated. The plating multilayer printed board 94 has a plating electrode 96 formed thereon, and is severed from the multilayer printed board 11 after the electroplating process, as in the first embodiment. A plating lead conductor 98 (a lead conductor for plating) formed on the multilayer printed board 94 connects between the plating electrode 96 and the lead conductor 92 formed on the multilayer printed board 11.

The plating multilayer printed board 94 significantly differs from the plating multilayer printed board 50 of the first embodiment in that it is attached to an edge of the multilayer printed board 11 other than the connector edge 16.

Figure 14:
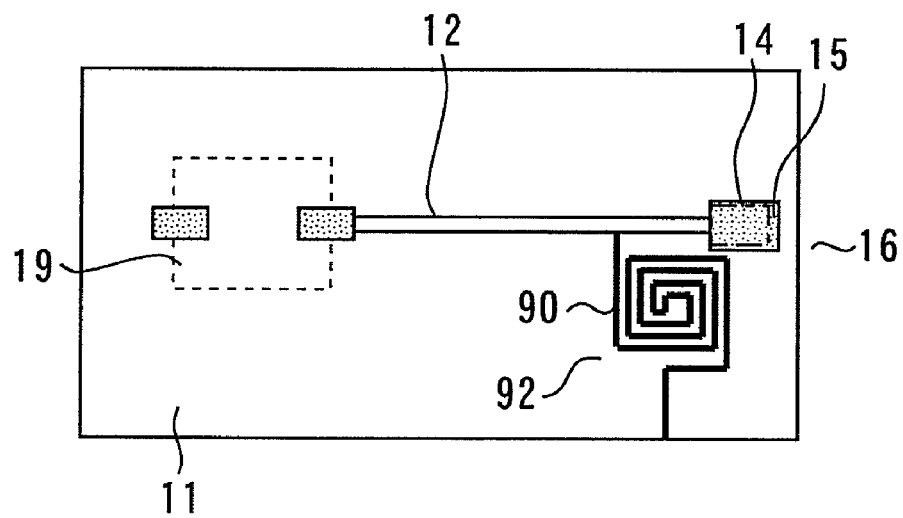
FIG. 14 shows the printed board after the electroplating.

With this connection, the edge connector is immersed in a plating solution and a voltage is applied to the plating electrode 96 to electroplate the electrical terminal 14. After completion of the electroplating, the plating multilayer printed board 94 is severed from the multilayer printed board 11, as shown in FIG. 14. The first electronic circuit 18 is then mounted on the electronic circuit mounting terminal 19. This completes the manufacture of the edge connector 91. It should be noted that the edge connector 91 of the present embodiment does not includes a via for electroplating, as described above.

Figure 15:
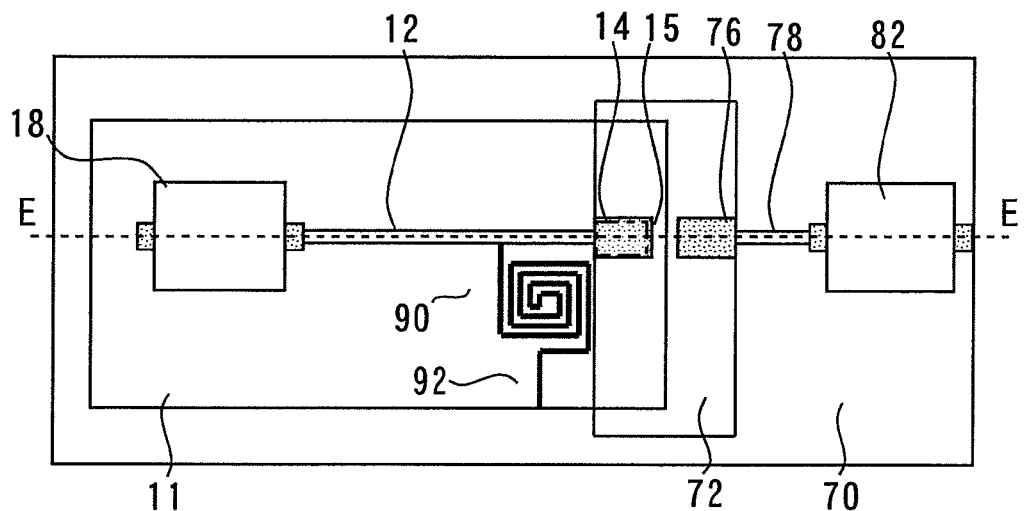
FIG. 15 is a plan view showing the edge connector after it has been inserted into the edge connector adapter.
Figure 16:
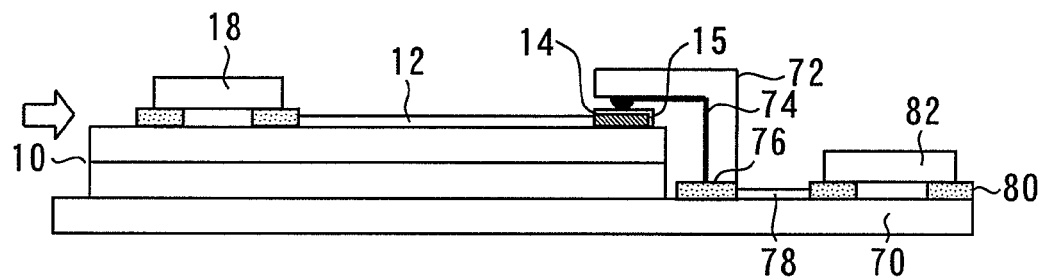
FIG. 16 is a cross-sectional view taken along broken line E-E of FIG. 15.

The edge connector 91 is then inserted into the edge connector adapter 72 described in connection with the first embodiment. FIG. 15 is a plan view showing the edge connector 91 after it has been inserted into the edge connector adapter 72. FIG. 16 is a cross-sectional view taken along broken line E-E of FIG. 15. As a result of the insertion, the first electronic circuit 18 is electrically connected to the second electronic circuit 82 through the electrical conductor 12, the electrical terminal 14, the inter-terminal member 74, the adapter electrical terminal 76, the electrical conductor 78, and the electronic circuit mounting terminal 80, as shown in FIG. 16. It should be noted that the inter-terminal member 74 is omitted from FIGS. 15 and 17 (described below) for convenience of illustration.

Figure 17:
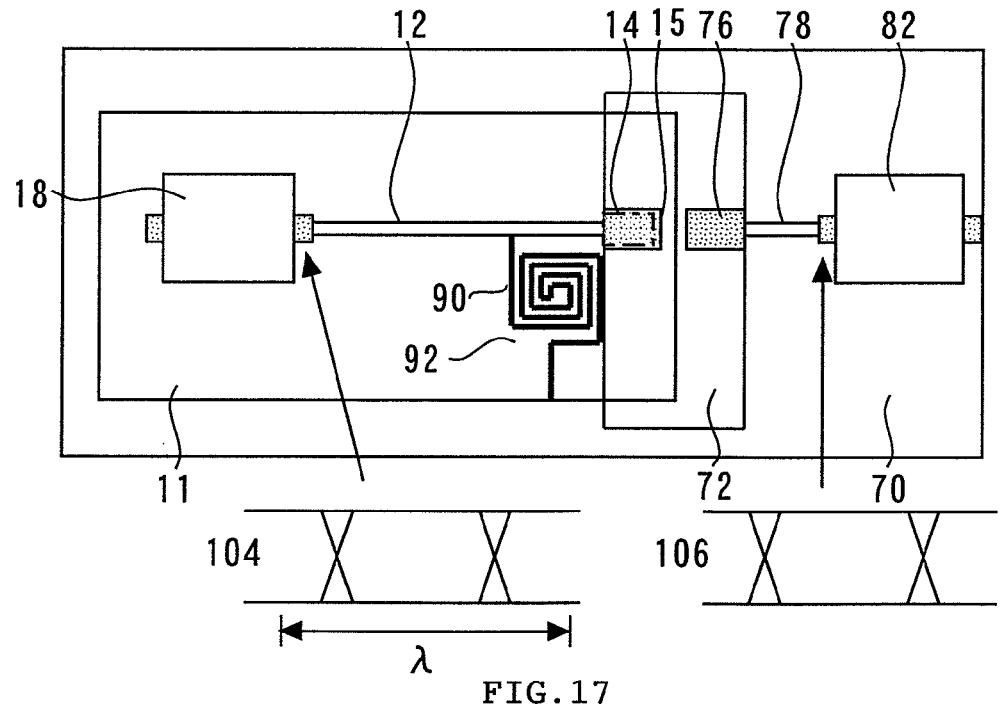
FIG. 17 shows the output waveform from the first electronic circuit and the input waveform to the second electronic circuit.

FIG. 17 shows the output waveform 104 from the first electronic circuit 18 and the input waveform 106 to the second electronic circuit 82. According to the present embodiment, the electrical signal output from the electronic circuit 18 is a high frequency signal having a signal band wavelength of $\lambda$. The input waveform 106 to the second electronic circuit 82 is identical to the output waveform 104 from the first electronic circuit 18, indicating that the high frequency signal suffers no degradation. This completes the description of the method for manufacturing and using the edge connector 91 according to the present embodiment.

According to the present embodiment, the lead conductor 92 remains on the multilayer printed board 11 even after removing the plating multilayer printed board 94, and acts as an open stub. The lead conductor 92 acting as the stub extends to an edge of the multilayer printed board 11 other than the connector edge, and therefore its length is greater than the sum of the length of the first via and the length of the first lead conductor of the edge connector 10 of the first embodiment. This results from the fact that one end of the lead conductor 92 is connected to the electrical conductor on the multilayer printed board 11 and the other end extends to an edge of the board other than the connector edge 16. Therefore, if the lead conductor 92 were of conventional construction (i.e., if it did not include the spiral conductor 90), it would be difficult to avoid degradation of the output waveforms from the edge connector.

On the other hand, according to the present embodiment, it is possible to avoid degradation of the output waveforms from the edge connector without shortening the lead conductor 92 used to electroplate the electrical terminal 14, since the lead conductor 92 includes the spiral conductor 90, which is constructed to offer high impedance to the electrical signals passing through the electrical conductor 12. Thus, the lead conductor 92 does not act to degrade the electrical signals, nor does it cause impedance mismatch.

Thus in the edge connector 91 of the present embodiment, the electrical terminal 14 is electroplated using the lead conductor 92, resulting in high productivity, low cost, and sufficient mating/unmating durability of the edge connector. Further, the lead conductor 92 is configured not to degrade the electrical signals passing through the electrical conductor 12 when the edge connector 91 is in use.

Figure 18:
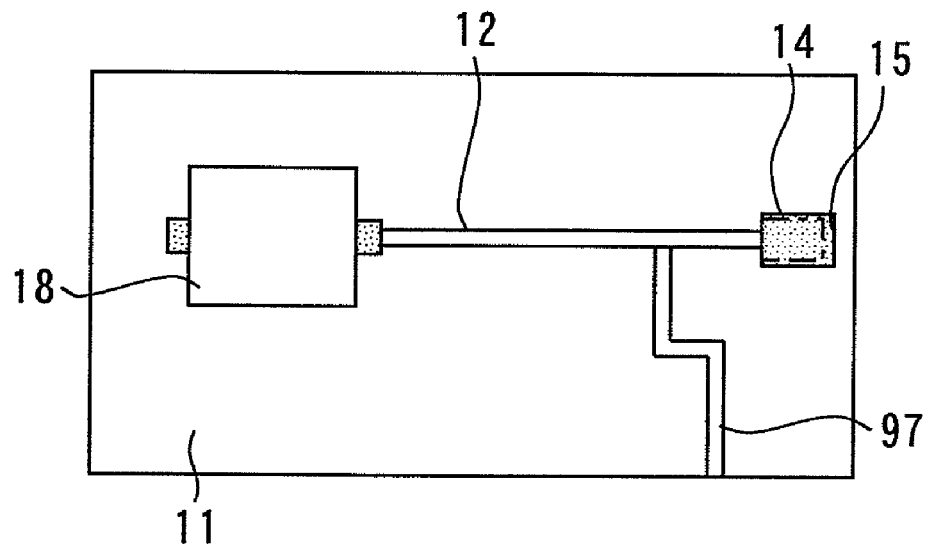
FIG. 18 shows the lead conductor having a stepped configuration.

Although the lead conductor of the edge connector of the present embodiment includes a spiral inductor to provide a high impedance, it is to be understood that the present invention is not limited to this particular lead conductor, but may utilize any suitable lead conductor that allows the electrical terminal of the edge connector to be electroplated and that offers a high impedance to the signals passing through the edge conductor. For example, the edge connector may include a lead conductor 97 having a stepped configuration as shown in FIG. 18 while still retaining the advantages of the present invention described above. More specifically, the abrupt bends of the lead conductor 97 provide parasitic reactance, thereby increasing the impedance of the lead conductor resulting in the advantages of the present invention described above.

Figure 19:
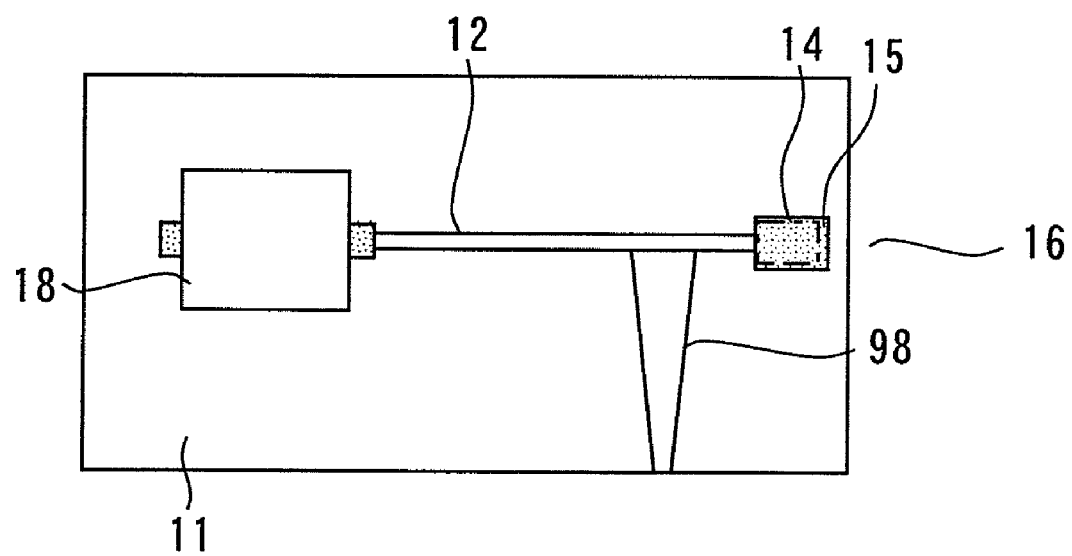
FIG. 19 shows the lead conductor of a tapered shape.

Further, the edge connector may instead include a lead conductor 98 of a tapered shape as shown in FIG. 19, with the same advantages. Specifically, the lead conductor 98 is connected at one end to the electrical conductor 12, and decreases in width toward the other end, which is located at an edge of the multilayer printed board 11 other than the connector edge 16.

In the present embodiment, the multilayer printed board 11 may be replaced by a single layer printed board, since the lead conductor for electroplating does not include a via and therefore the inner substrate or layer of the multilayer printed board 11 can be omitted.

Although in the present embodiment one end of the lead conductor 92 is connected to the electrical conductor 12, it is to be understood that in other embodiments that end of the lead conductor 92 may be connected to the electrical terminal 14. Further, a plurality of electrical terminals may be arranged along the connector edge 16, as described in connection with the first embodiment.

Further, various other alterations may be made to the present embodiment without departing from the scope of the present invention.

Thus the present invention enables electrical terminals to be electroplated without any problem.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-318501, filed on Dec. 15, 2008 including specification, claims, drawings and summary, on which the Convention priority of the present application is based, are incorporated herein by reference in its entirety.

What is claimed is:

1. An edge connector comprising:
    a multilayer printed board having an inner layer and a connector edge;
    an electronic circuit disposed on said multilayer printed board;
    an electrical terminal on said multilayer printed board and spaced by a predetermined clearance from said connector edge;
    an electrical conductor on said multilayer printed board and electrically connecting said electronic circuit and said electrical terminal to each other;
    a via connected to said electrical terminal and extending to said inner layer of said multilayer printed board; and
    a lead conductor on said inner layer of said multilayer printed board and connected at a first end to said via, a second end of said lead conductor being exposed at said connector edge, wherein
        said electrical terminal is plated, and
        said via and said lead conductor have respective lengths and the sum of the length of said via and the length of said lead conductor is less than one-sixth of the wavelength of an electrical signal transmitted through said electrical conductor.

2. The edge connector according to claim 1, wherein said lead conductor has a spiral configuration.

3. The edge connector according to claim 1, wherein said lead conductor has at least one bend.

4. The edge connector according to claim 1, wherein said lead conductor decreases in width from said first end to said second end.

* * * * *